(12) United States Patent
Zhang

(10) Patent No.: US 7,614,908 B2
(45) Date of Patent: Nov. 10, 2009

(54) INSULATING METER JAW GUIDE FOR A WATT-HOUR METER SOCKET

(75) Inventor: Fan Zhang, Suwanee, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 12/024,670

(22) Filed: Feb. 1, 2008

(65) Prior Publication Data

US 2009/0061679 A1    Mar. 5, 2009

Related U.S. Application Data

(60) Provisional application No. 60/968,202, filed on Aug. 27, 2007.

(51) Int. Cl.
*H01R 33/945* (2006.01)
(52) U.S. Cl. ...................................... 439/517; 439/744
(58) Field of Classification Search ................. 439/517, 439/744
See application file for complete search history.

(56) References Cited

U.S. PATENT DOCUMENTS

| | | | | |
|---|---|---|---|---|
| 2,769,151 A | * | 10/1956 | Salomone | 439/212 |
| 3,735,332 A | * | 5/1973 | Tirrell | 439/744 |
| 4,104,588 A | | 8/1978 | Westberry | |
| 4,430,579 A | * | 2/1984 | Wiktor | 307/134 |
| 4,690,843 A | | 9/1987 | Inagaki | |
| 6,734,663 B2 | * | 5/2004 | Fye et al. | 324/142 |
| 7,347,722 B2 | * | 3/2008 | Zhang et al. | 439/517 |

* cited by examiner

*Primary Examiner*—Truc T Nguyen
(74) *Attorney, Agent, or Firm*—Jose de la Rosa

(57) ABSTRACT

The invention provides an insulating meter jaw guide featuring a loop belt, a retaining fastener, a meter blade receiving slot, and a cavity housing. The insulating meter jaw guide may be positioned on a meter jaw of watt-hour meter socket, effectively covering the receiving end of a meter jaw or a meter jaw assembly, therefore, protecting the meter jaw from accidental contact by a meter cover or the like.

12 Claims, 4 Drawing Sheets

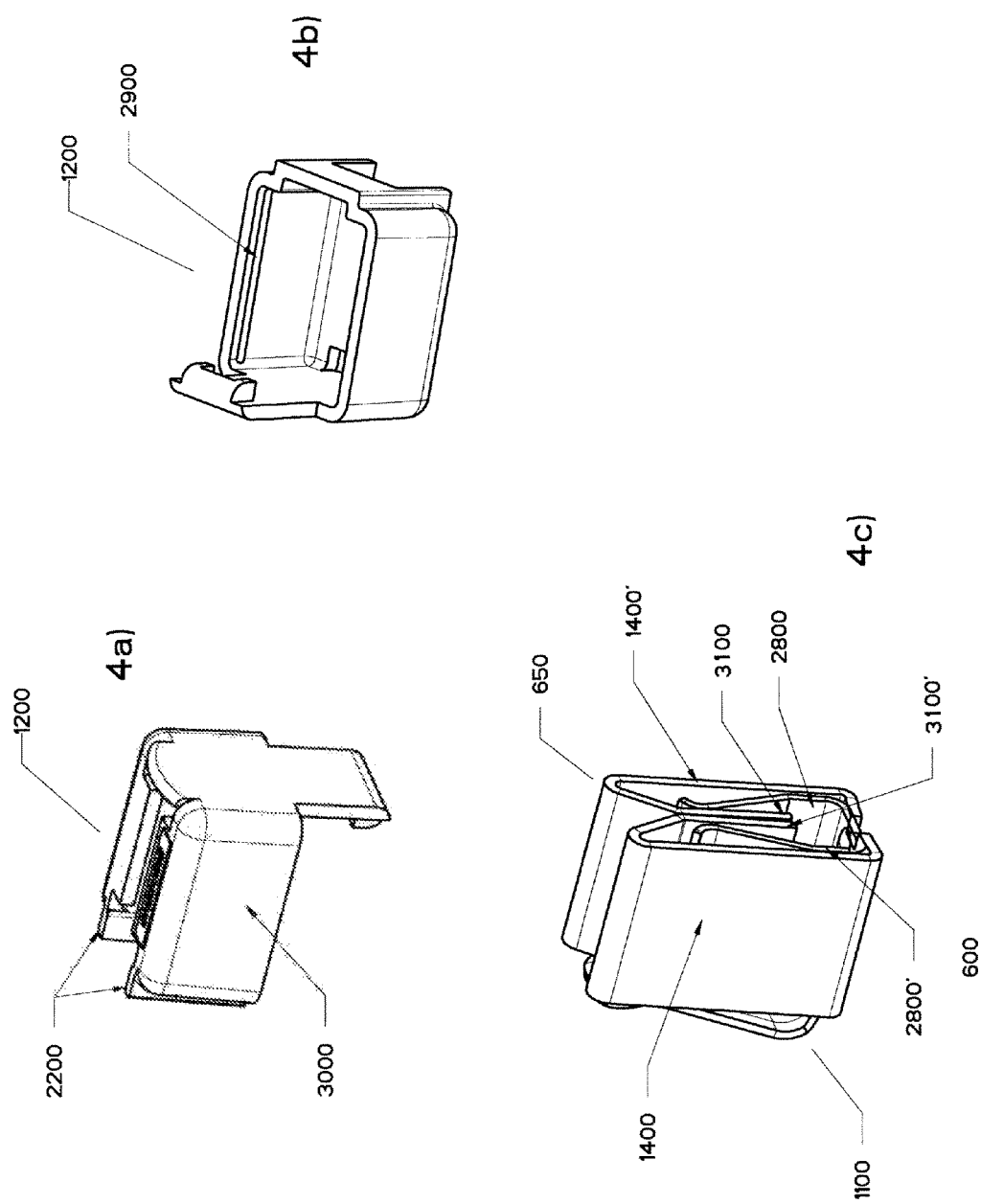

INSULATING METER JAW GUIDE FOR A WATT-HOUR METER SOCKET

CROSS REFERENCE OF RELATED APPLICATION

This application claims priority to and incorporates by reference herein in its entirety, pending U.S. Provisional Patent Application Ser. No. 60/968,202 filed on Aug. 27, 2007.

FIELD OF INVENTION

This invention relates to a meter socket assembly having an insulating meter jaw guide for use with a watt-hour meter.

BACKGROUND

Socket type electrical watt-hour meters are used to measure and indicate the amount of electrical power consumption in a residence, industry or business. Typically, a socket type watt-hour meter plugs into a meter socket using blade-like stabs or meter blade connectors located on the watt-hour meter. The meter socket itself is mounted inside a meter base or a panel. A meter socket commonly has a spring loaded receptacle-like jaw to receive and contact the watt-hour meter blade insertion. The meter jaw and spring provide a sufficient clamping force on the meter blades and conduct electricity while maintaining a certain current load and a heat rise.

Most utility companies in the United States require meter jaw guides to be installed on watt-hour meter sockets for locating the blades of watt-hour meters in the correct contact position. There are two types of material used for meter jaw guides: metal and thermal plastic. Metal meter jaw guides, are installed in pairs either on the outside or inside of line and load meter jaws. This provides a forceful guide to meter blades on effective contact position when a watt-hour meter is installed.

At this time, thermal plastic meter guides are required by most utility companies for selective ring type meter socket assemblies. A thermal plastic meter jaw guide may cover a meter jaw and may be self-retaining on the jaw. A closing slot on the receiving side of a thermal plastic meter jaw guide limits a meter blade in the slot. Therefore, thermal plastic meter jaw guides will locate the watt-hour meter in an effective contact position. Thermal plastic meter jaw guides also insulate line meter jaws from non-intentional contact. This will serve as an additional protective feature for electricians who are working with watt-hour meters without disconnecting electrical power.

One disadvantage of using thermal plastic is that the physical properties of thermal plastic show less strength and softer composition at high temperature. As a result, the thermal plastic meter jaw guide may break if excessive force is needed to insert a watt-hour meter. Therefore, some utility companies reject thermal plastic meter jaw guides and prefer metal meter jaw guides.

Another disadvantage commonly faced relates to a ring type meter covers having a reinforced return flange on the top end. The edge of the return flange, if lower than the side of supporting walls of the meter cover, may contact the bearings of line meter jaw or meter jaws during removal of the meter cover. A contact between the meter cover and "hot" meter jaw or meter jaws may cause electrical shock and/or short circuit, which may result in personal or property damage.

Therefore there is a need for improvement to provide a reliable meter jaw guide for locating meter blades in the meter jaw and to provide protection from contact with a meter jaw.

SUMMARY OF INVENTION

In accordance with one aspect of this invention, the method to insulate a meter jaw assembly for an electric meter box, comprising the steps of: providing the meter jaw assembly comprising a metal meter jaw guide in combination with a meter jaw for securing insertion of a meter blade of a watt hour meter; and providing an insulating meter jaw guide wherein the insulating meter jaw guide overlays the meter jaw assembly.

In accordance with another aspect of this invention, a meter socket device for an electrical meter box comprising: a meter jaw assembly for securing and contacting a meter blade of a watt hour; meter socket base for mounting the meter jaw assembly; and an insulating meter jaw guide overlaying the meter jaw assembly.

In accordance with another aspect of this invention, a meter jaw assembly for an electric meter box comprising: a metal meter jaw guide in combination with a meter jaw for securing insertion of a meter blade of a watt hour meter; and an insulating meter jaw guide overlaying the meter jaw in combination with the metal meter jaw guide.

It is an object of this invention to protect meter jaws and metal meter jaw guides from accidental contact during operating a watt-hour meter or removing, installing, or replacing a meter cover.

BRIEF DESCRIPTION OF DRAWINGS

FIG. 3 b) is a perspective view of the meter jaw with a metal jaw guide.

FIG. 4 a) is an enlarged view of varying angle of the insulating meter jaw guide.

FIG. 4 b) is an enlarged view of the insulating meter jaw guide turned upside down.

FIG. 4 c) is an enlarged and varying view of a combination of a meter jaw and a metal meter jaw guide.

DESCRIPTION

Figure 1:
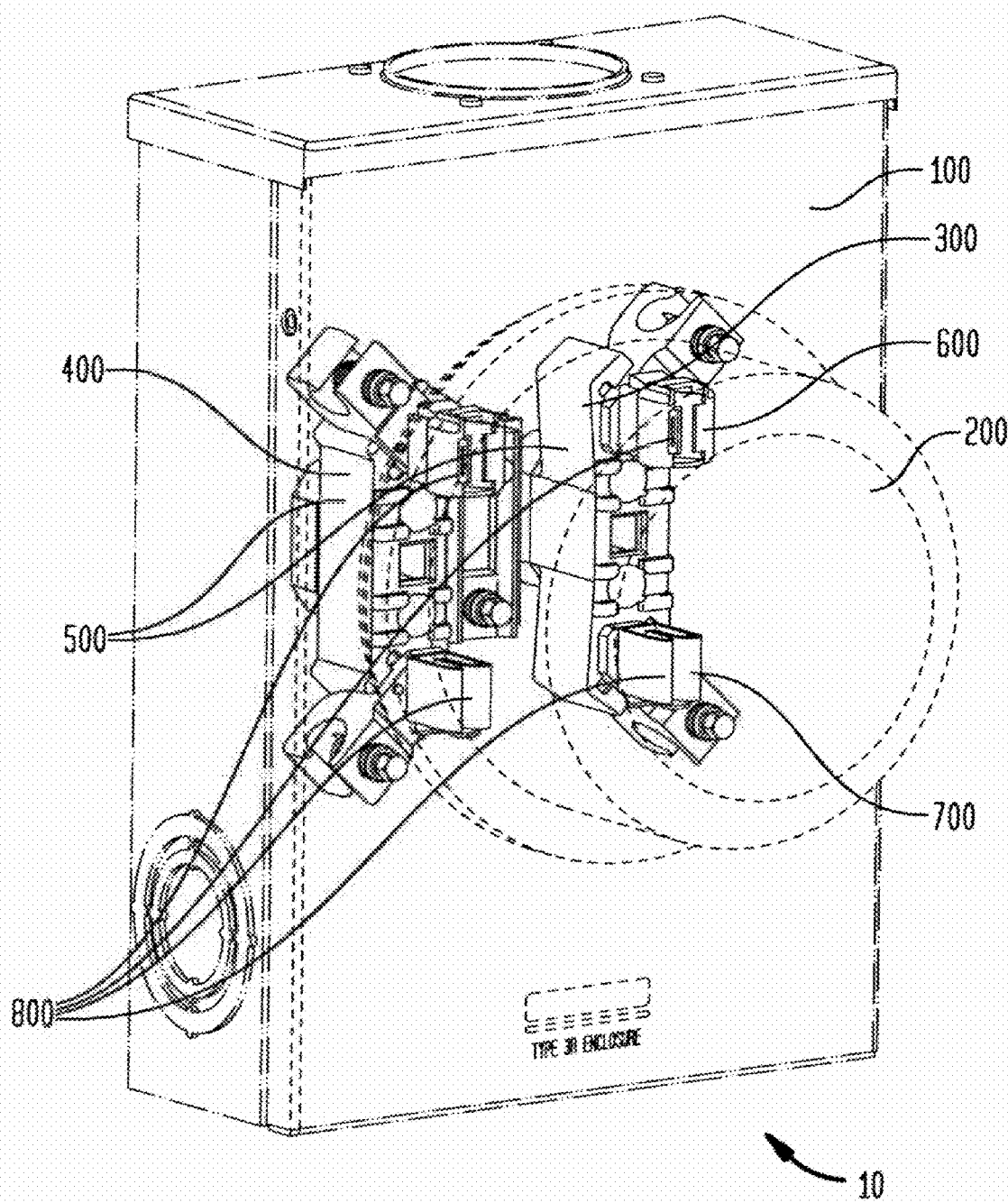
FIG. 1. is a perspective view of a meter socket device.

FIG. 1 shows an electrical meter socket device 10. The meter socket device 10 includes an enclosure 100 and a watt-hour meter 200. The watt hour meter 200 is shown in phantom line to reveal the meter socket assemblies 500 (right meter socket assembly 300 and left meter socket assembly 400) located inside. In residential applications, most meter socket devices 10 may contain a 4 or 5-meter jaw sockets for connecting 2 pair of parallel meter blades (not shown but well known to those skilled in the art) from the watt-hour meter 200. Each pair of meter blades from the watt-hour meter 200 connects to one phase of utility power for consumption through a meter socket device 10. The consumption of electrical power is measured when the currents flow in from a line meter jaw assembly 600 (also shown in FIG. 2) to line meter blades then through the watt hour meter 200 then flow back out from load meter blades to load meter jaw assembly 700 (also shown in FIG. 2). The enclosure 100 provides protection to all electrical connections and links the utility electrical power lines to the lines connected to consumer distribution panels. When the watt-hour meter 200 is installed and sealed, all internal connectors are enclosed and protected by the watt-hour meter 200 and the enclosure 100. For ease of reference, line meter jaw assembly 600 and load meter jaw assembly 700 will collectively be called meter jaw assemblies 800.

Figure 2:
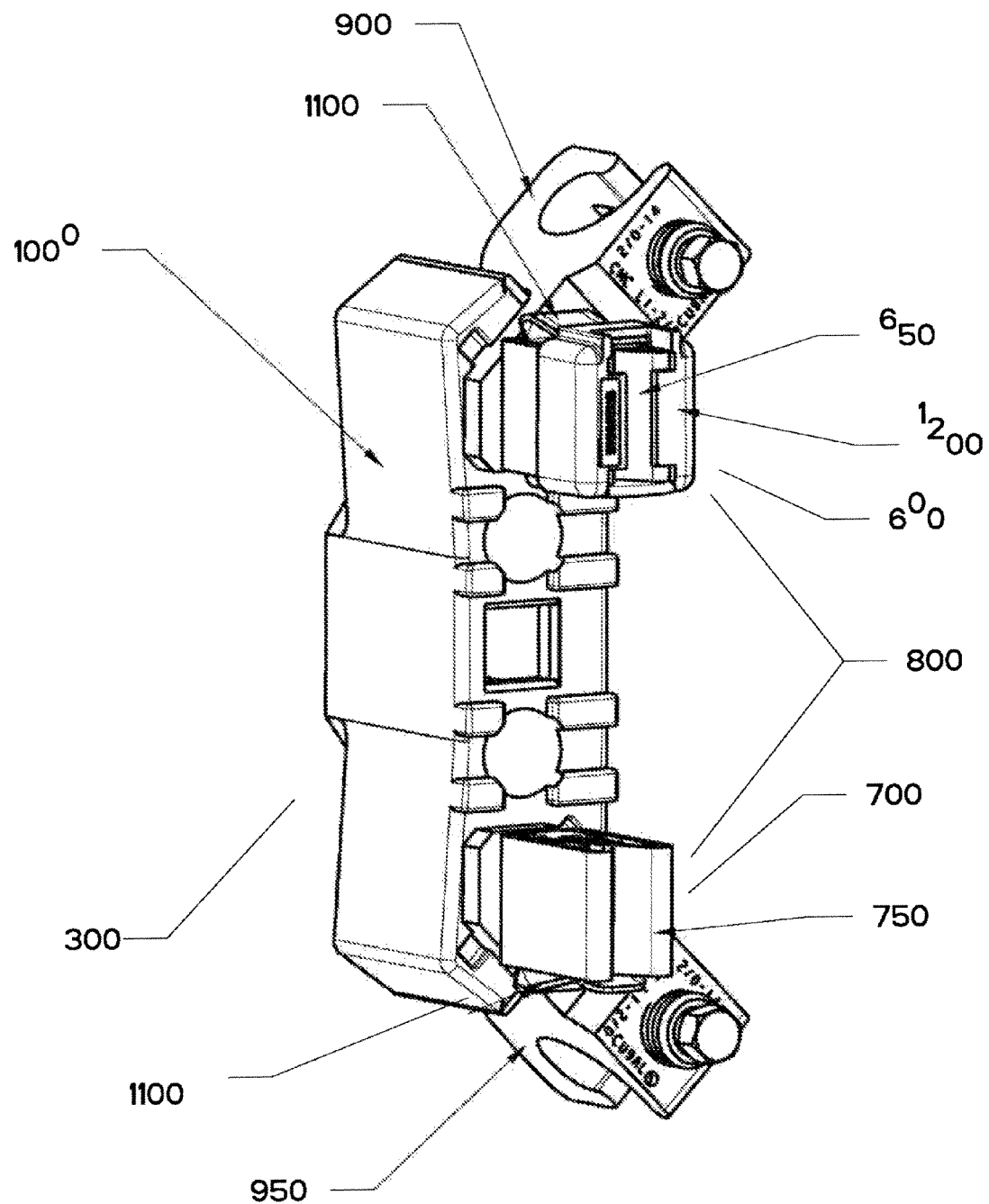
FIG. 2. is a perspective view of a meter socket block assembly including an insulating meter jaw guide.

FIG. 2 shows the right meter socket assembly 300. The line lug 900 connects utility electrical power line to receive electrical power. The electrical power is transferred to line meter jaw assembly 600. Passing through a watt-hour meter, the electrical power is delivered to the load meter jaw assembly 700 then to the load lug 950 for customer consumption. The line and load lugs 900/950 and the meter jaw assemblies 800 are all installed on a plastic base 1000, which provides mounting and support for the conductors and provides insulation between them. To receive a watt-hour meter 200, the meter jaw assemblies 800 of the right meter socket assembly 300 are installed on top of the plastic base 1000, reaching out above any other components. Once the utility line is connected and utility provides electricity, the line lug 900 and line meter jaw assembly 600 remain connected to the electrical power source. Even though the watt-hour meter 200 is removed, the electrical power on load meter jaw 700 and load lug 950 is interrupted (disconnected), but the electrical power on line lug 900 remains connected and the line lug 900 and line meter jaw assembly 600 remain energized. Therefore, an insulating meter jaw guide 1200 is strongly recommended to safe guard the line meter jaw assembly 600 from non-intentional contact.

Line meter jaw assembly 600 comprises a line meter jaw 650, a metal meter jaw guide 1100 and an insulating meter jaw guide 1200. Load meter jaw assembly 700 comprises a load meter jaw 750 and a metal meter jaw guide 1100. The line/load meter jaws 650 and 750 have return fold leads 3100/3100' (shown in FIG. 4*c*) to receive and clamp watt-hour meter blades. The meter jaw assemblies 800 align to match the position of the two meter blades of the same phase under a watt-hour meter 200. The metal meter jaw guide 1100 has a meter blade guide finger 2700 (as shown in FIG. 3*b*). The meter jaw guides 1100 in meter jaw assemblies 800 couple together with their meter blade guide fingers 2700. The meter blade guide fingers 2700 may be fixed either externally or internally to the meter jaw assemblies 800, allowing the meter blade guide fingers 2700 to bias meter blades in an opposite direction. This forces the meter blades of a watt-hour meter 200 to be inserted in the line/load meter jaws 650 and 750 with proper contact.

Figure 3A:
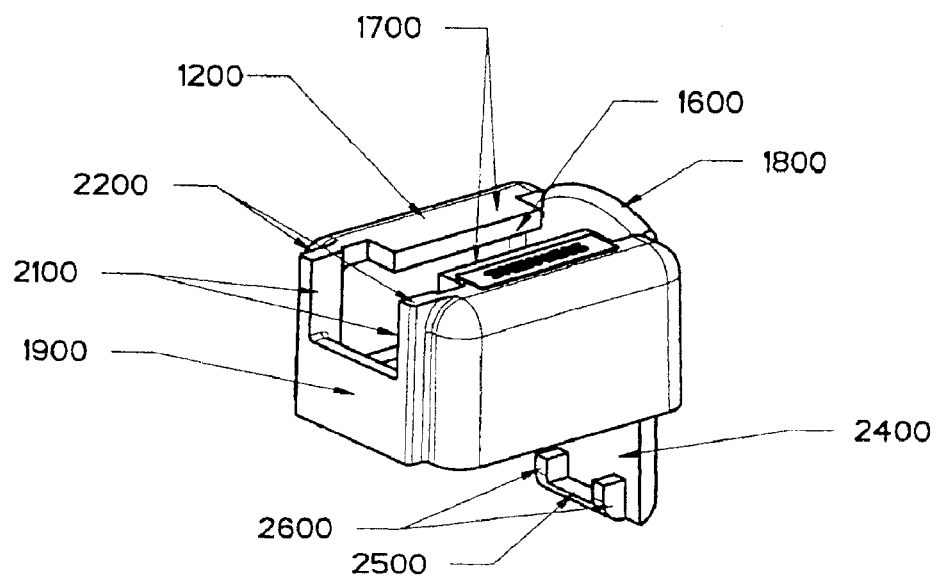
FIG. 3 a) is a perspective view of the insulating meter jaw guide.
Figure 3B:
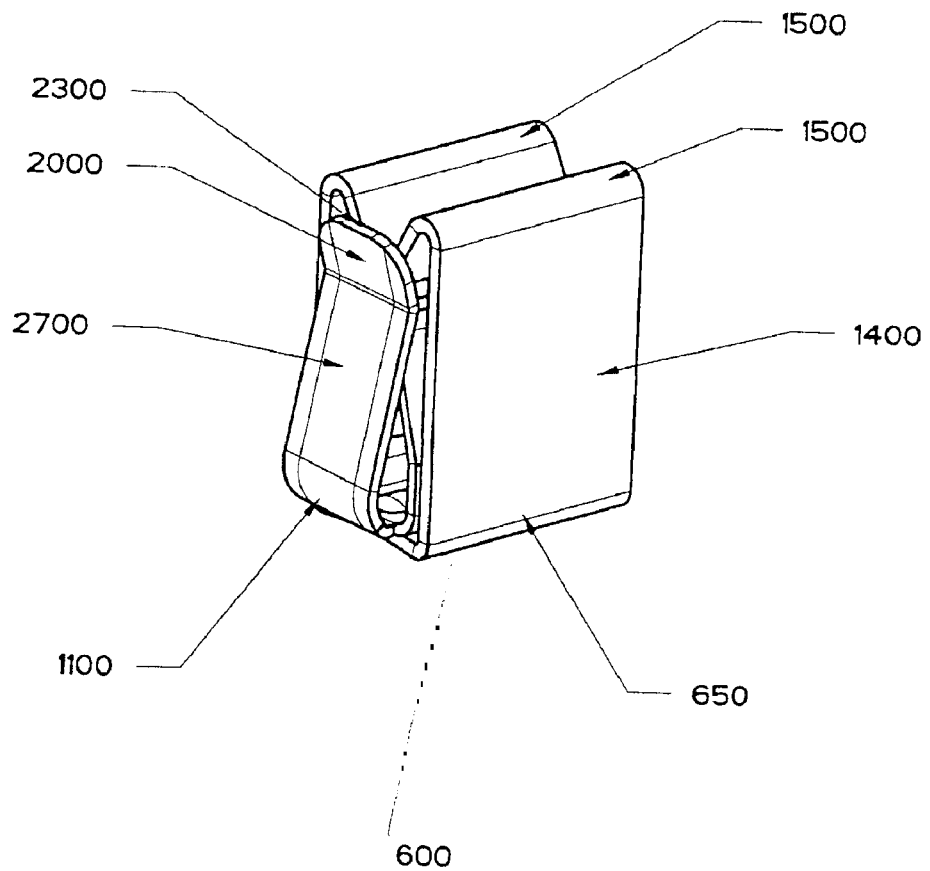

FIG. 3 *a*) shows an enlarged view of an insulating meter guide 1200 ready for installation. FIG. 3 *b*) shows an enlarged view of line meter jaw assembly 600 where the line meter jaw 650 and the metal meter jaw guide 1100 are assembled together. The insulating meter jaw guide 1200 includes a rectangle cavity housing overlaying the meter jaw 650 and the metal meter jaw guide 1100 by covering top portion of side walls 1400 and top return surface 1500 and 1500'. Closing end 1700 of the insulating meter jaw guide 1200 has opening slot 1600 to receive meter blade insertion while closing end 1700 covers the top return surface 1500 and 1500' of the meter jaw 650. Extended bumper 1800 on the insulating meter jaw guide 1200 prevents unexpected objects from contacting the meter jaw 650. The loop belt 1900 on the insulating meter jaw guide 1200 wraps around and hooks between the meter blade guide finger 2700 and its receiving lead 2000. The opened portion of the loop belt 1900 relieves the outward biased receiving lead 2000. The side walls 2100 of opened portion of the loop belt 1900 and extended top walls 2200 surrounds the top edge 2300 of the metal meter jaw guide 650 for protection. On the other side of the insulating meter jaw guide 1200, an extended leg 2400 includes a "U" shaped retaining fastener 2500. The "U" shaped retaining fastener 2500 acts as snap stab and locks to the end of the return connection walls 3100 and 3100' (shown in FIG. 4*c*) of the meter jaw 650. The side surfaces 2600 of the "U" shaped retaining fastener 2500 are wide enough to fix the end corner of the return connection walls 3100 and 3100' and small enough to fit between the spring fingers 2800 and 2800' (shown in FIG. 4*c*) of the metal meter jaw guide 1100.

FIGS. 4 *a*) and 4 *b*) show an enlarged and varying view of the insulating meter guide 1200. FIG. 4 *b*) focuses on the insulating meter guide 1200 turned upside down. The ribs 2900 inside the side walls 3000 provide a tighter fit to the side walls 1400 and 1400' shown in FIG. 4*c*) of the meter jaw assembly 600.

While the foregoing description and drawings represent the preferred embodiments of the present invention, it will be apparent to those skilled in the art that various changes and modifications may be made therein without departing from the true spirit and scope of the present invention.

The invention claimed is:

1. A method for insulating a meter jaw assembly for an electric meter box, comprising the steps of:

providing the meter jaw assembly comprising a metal meter jaw guide in combination with a meter jaw for securing insertion of a meter blade of a watt hour meter, wherein said metal meter jaw guide comprises a guide finger having an outward biased receiving lead portion;

providing an insulating meter jaw guide wherein the insulating meter jaw guide overlays the meter jaw assembly; and providing a loop belt on the meter jaw guide, the loop belt wrapping around the metal meter jaw guide and hooking between the guide finger and the outward biased receiving lead portion of the metal meter jaw guide.

2. The method of claim 1, wherein the insulating meter jaw guide comprises a rectangular cavity housing with a receiving slot to receive a meter blade of a watt hour meter while shielding the meter jaw assembly from contact.

3. The method of claim 1, wherein the loop belt comprises an opening portion allowing the outward biased receiving lead portion of the guide finger on the metal meter jaw guide to freely guide a blade of a watt hour meter into the meter jaw.

4. The method of claim 1, wherein the insulating meter jaw guide comprises a retaining fastener to lock to the meter jaw.

5. A meter socket device for an electrical meter box comprising:

a meter socket base;

a meter jaw installed on the meter socket base and for securing and contacting a meter blade of a watt hour meter, the meter jaw comprising a metal meter jaw guide comprising a guide finger having an outward biased receiving lead portion; and an insulating meter jaw guide overlaying the meter jaw and comprising a loop belt, the loop belt wrapping around the metal meter jaw guide and hooking between the guide finger and the outward biased receiving lead portion of the metal meter jaw guide.

6. The meter socket device of claim 5, wherein the insulating meter jaw guide comprises a rectangular cavity housing with a receiving slot to receive a meter blade of a watt hour meter while shielding the metal meter jaw guide and meter jaw from contact.

7. The meter socket device of claim 5, wherein the loop belt comprises an opening portion allowing the outward biased receiving lead portion of the guide finger on the metal meter jaw guide to freely guide a blade of a watt hour meter into the meter jaw.

8. The meter socket device of claim 5, wherein the insulating meter jaw guide comprises a retaining fastener to lock to the meter jaw.

9. A meter jaw assembly for an electrical meter box comprising:
- a metal meter jaw guide in combination with a meter jaw for securing insertion of a meter blade of a watt hour meter, the metal meter jaw guide comprising a guide finger having an outward biased receiving lead portion; and
- an insulating meter jaw guide overlaying the meter jaw in combination with the metal meter jaw guide and comprising a loop belt, the loop belt wrapping around the metal meter jaw guide and hooking between the guide finger and the outward biased receiving lead portion of the metal meter jaw guide.

10. The meter jaw assembly of claim 9, wherein the insulating meter jaw guide comprises a rectangular cavity housing with a receiving slot to receive the meter blade of the watt hour meter while shielding the metal meter jaw guide and meter jaw from contact.

11. The meter jaw assembly of claim 9, wherein the loop belt comprises an opening portion allowing the outward biased receiving lead portion of the guide finger on the metal meter jaw guide to freely guide the blade of the watt hour meter into the meter jaw.

12. The meter jaw assembly of claim 9, wherein the insulating meter jaw guide comprises a retaining fastener to lock to the meter jaw.

\* \* \* \* \*